United States Patent [19]
Kopp et al.

[11] Patent Number: 6,085,281
[45] Date of Patent: Jul. 4, 2000

[54] METHOD AND A DEVICE FOR PERFORMING A FLASH EEPROM

[75] Inventors: Dieter Kopp, Hemmingen; Jürgen Sienel, Leonberg, both of Germany

[73] Assignee: Alcatel, Paris, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/757,574

[22] Filed: Nov. 27, 1996

[30] Foreign Application Priority Data

Nov. 30, 1995 [DE] Germany .............................. 195 44 571

[51] Int. Cl.⁷ ...................................................... G06F 12/08
[52] U.S. Cl. ........................... 711/103; 711/110; 711/117; 711/169; 709/107; 713/503; 365/185.33; 379/67.1; 379/88.07; 379/88.28
[58] Field of Search ..................................... 711/103, 166, 711/169, 110, 117, 156, 217, 219; 365/185.33; 379/67.1, 88.07, 88.28; 713/503; 709/107

[56] References Cited

U.S. PATENT DOCUMENTS

| | | | |
|---|---|---|---|
| 4,752,871 | 6/1988 | Sparks et al. ............................ | 711/103 |
| 4,939,437 | 7/1990 | Farag et al. .............................. | 318/473 |
| 5,224,070 | 6/1993 | Fandrich et al. . | |
| 5,377,145 | 12/1994 | Kynett et al. . | |
| 5,386,183 | 1/1995 | Cronvich et al. ........................ | 318/434 |
| 5,448,524 | 9/1995 | Machida .............................. | 365/189.12 |
| 5,488,711 | 1/1996 | Hewitt et al. ............................ | 711/103 |
| 5,509,134 | 4/1996 | Fandrich et al. ......................... | 711/103 |
| 5,519,765 | 5/1996 | Sonoda et al. ........................... | 379/67.1 |
| 5,579,502 | 11/1996 | Konishi et al. .......................... | 711/103 |
| 5,696,929 | 12/1997 | Hasbun et al. ........................... | 711/103 |
| 5,745,793 | 4/1998 | Atsatt et al. .............................. | 710/61 |
| 5,802,344 | 9/1998 | Menon et al. ............................ | 711/165 |

FOREIGN PATENT DOCUMENTS

| | | |
|---|---|---|
| 0489204 | 6/1992 | European Pat. Off. . |
| 0622808 | 11/1994 | European Pat. Off. . |
| 3733717 | 4/1989 | Germany . |
| 4332063 | 3/1995 | Germany . |

OTHER PUBLICATIONS

Literature, AM29F040—Advanced Micro Devices from Publication #17113, Rev. B Amendment/0, Issue Date: Oct. 1993, pp. 7–12.
Patent Abstracts of Japan—5–144300 A, P–1620, Sep. 27, 1993, vol. 17, No. 536.
Patent Abstracts of Japan—4–13298 A, P–1341, Apr. 21, 1992, vol. 16, No. 163.
Patent Abstracts of Japan—5–128876 A, P–1612, Sep. 13, 1993, vol. 17, No. 509.
AMD Flash Memory Products, Data Book/Handbook, 1994/95, pp. I–87–I–94.
INTEL Flash Memory, vol. 1, 1994, pp. 3–84 –3–92.

*Primary Examiner*—Hiep T Nguyen
*Attorney, Agent, or Firm*—Ware, Fressola, Van Der Sluys & Adolphson LLP

[57] ABSTRACT

An initiating processing unit is normally occupied during the programming of flash EEPROMs. The time of occupation becomes ever longer with increasing age and degree of utilization of the flash EEPROMs. Here, the processing unit uses an initiatable interrupt routine, which triggers a programming of the flash EEPROM and is then terminated in order to use the programming to further process a main program at the same time. A timer function in a processing unit is used to trigger an interrupt routine. The interrupt routine checks the initial conditions and in the case when an initial condition has been fulfilled, the programming of the flash EEPROM is triggered, whereupon the execution of the main program continues in the processing unit during the programming.

15 Claims, 1 Drawing Sheet

METHOD AND A DEVICE FOR PERFORMING A FLASH EEPROM

TECHNICAL FIELD

The present invention is directed to a method of programming a flash EEPROM.

BACKGROUND OF THE INVENTION

Flash EEPROMS (lash-Electronically Erasable Programmable Read-Only-Memory) are frequently used semiconductor memories. These memory units have the characteristic of being erasable and directly rewritable by means of simple control signals. In their starting condition the bits of said flash EEPROMs are in a defined condition, the number one e.g. in this case. For programming, these bits are set from one to zero, or to one if the defined condition is zero. A respective programming action takes place in a way so that the individual bits are checked and a bit is set from one to zero for programming. This setting is accomplished by a change in potential, which is initiated by a processing unit through a programming sequence, thus a sequence of programming steps. It is directly or indirectly connected to the flash EEPROM. Algorithms which monitor the programming operate inside the flash EEPROM.

Such programming becomes especially time-critical when the age of the unit being used increases, and the frequency of use increases accordingly. This means that the flash EEPROM has been programmed and then erased again n-times. It was proven that in "older" units such programming times can be between $8\mu$ and 1 ms. If algorithms which operate inside the flash EEPROM monitor such programming as explained earlier, no further task can be carried out by the processing unit during the programming time and while so-called data polling algorithms are in use.

Such data polling algorithms in conjunction with the corresponding memory units are known from the following publication: AMD flash memory products, Data Book/Handbook 1994/95. It explains that said data polling is a method which indicates to the processing unit, hereafter called CPU, if a programming is still in operation or if it has already ended. However, no further program such as the main program can be carried out by the CPU while said data polling algorithms are being used.

A further state-of-the-art technique of the Intel Company describes "byte write flash block erase polling algorithms". It describes a hardware method for determining whether the writing of a byte or the erasing of a block has been completed. In this case as well, the CPU cannot carry out any further programs during this writing procedure (from Intel Flash Memory, Volume 1, 1994).

As stated earlier, the CPU is occupied by both of these previously introduced algorithms during the writing. Since longer time periods result when a flash EEPROM is programmed by an older unit, and such time periods are used to program this memory, it can lead to very long occupation times of the CPU during which it is not available to carry out programs.

SUMMARY OF THE INVENTION

Accordingly it is the task of this invention to develop a method and a device whereby the CPU is not occupied while programming a flash EEPROM. According to the invention this is fulfilled by a method of programming a flash EEPROM, wherein a main program is executed for processing data in a processing unit, wherein the main program writes the processed data into a buffer, wherein an interrupt routine is initialized by the processing unit at regular time intervals, wherein the interrupt routine checks an initial condition and, if the initial condition is fulfilled, reads the data from the buffer and sends a programming sequence to the flash EEPROM to be programmed, and wherein after the programming sequence has been sent, the execution of the main program is resumed while programming of the flash EEPROM is taking place. It is also fulfilled by an apparatus for programming a flash EEPROM, comprising a processing unit which executes a main program and initializes an interrupt routine, a buffer into which data processed by the main program is written, and the flash EEPROM, which is programmed by the interrupt routine checking an initial condition, reading data from the buffer, and sending a programming sequence to the flash EEPROM to be programmed.

A particular advantage is that no loss of real-time reception of calls takes place for example in time-critical applications, such as a digital telephone answering machine or a voice mail-box for example, because with longer programming times which can extend up to 1 ms, this would lead to the loss of the real-time reception of calls, which would heavily constrain the user friendliness of the device.

BRIEF DESCRIPTION OF THE DRAWINGS

The invention will be explained in more detail in the following by means of figures, where.

BEST MODE FOR CARRYING OUT THE INVENTION

Figure 1:
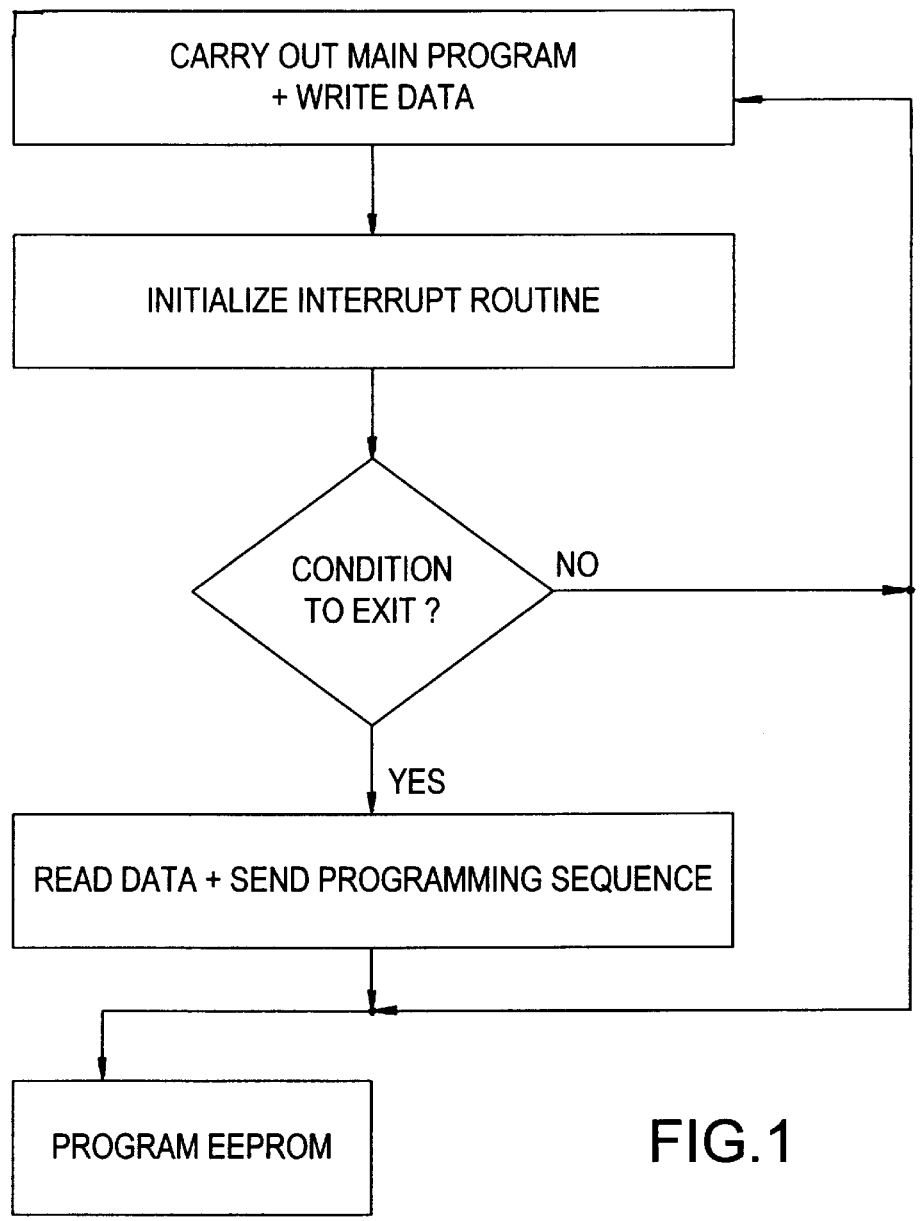
FIG. 1 is a flow diagram of a method according to the invention.

The following explains the method in detail by means of FIG. 1. The method for programming a flash EEPROM comprises the following steps. A main program for processing data runs in a processing unit. This main program causes processed data to be written to a buffer memory. In a particular configuration, this buffer memory can be a circular buffer for example. If a conventional processing unit such as for example a microcontroller or a digital signal processing (DSP) is used, this processing unit generally includes a timer function. When this timer function is used, the currently running main program is interrupted at regular intervals of time. In addition, it initializes an interrupt routine. The interrupt routine checks an initial condition. The main program continues to be carried out in the event this initial condition is not fulfilled. However, in the event this initial condition is fulfilled, the data are read from the buffer memory and a programming sequence is sent to the flash EEPROM to be programmed. This takes place precisely in the case where data to be written are still present in the buffer memory. The main program continues to be carried out after the programming sequence has been sent to the flash EEPROM. The programming of the flash EEPROM takes place at the same time. One of the initial conditions is for the last programming to have been successfully completed. Because if the flash EEPROM is still in the write state, no new programming sequence with new data to be written must be sent to the flash EEPROM, rather a previously initiated write process must first be successfully completed.

After the writing is finished, further checks are made to find out whether it was successfully completed, namely entirely and without errors.

Another advantageous configuration is to select the time period between the initialization of interrupt routines to be longer than an average programming time of the flash EEPROM. This can save some time. It is then assumed that with each interrupt routine a successfully completed programming action has run previously in the flash EEPROM where, as already mentioned before, the main program continues to run at the same time.

Figure 2:
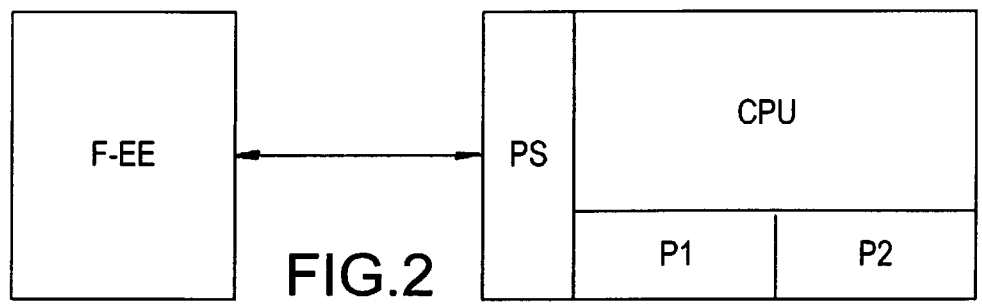
FIG. 2 is a circuit diagram of a device according to the invention for carrying out the method.

A device for programming a flash EEPROM is explained in greater detail in the following by means of FIG. 2.

The device for programming a flash EEPROM includes a processing unit CPU which carries out a main program P1, and whereby an interrupt routine P2 is initialized. The main program P1 in the processing unit CPU writes processed data to a buffer memory PS. In an advantageous configuration this buffer memory is a circular buffer. The interrupt routine P2 reads data from the buffer memory PS, and a flash EEPROM F-EE, which is to be programmed, is programmed in that the interrupt routine P2 reads data from the buffer memory PS and sends a programming sequence. It is understood that a programming sequence is a series of programming steps.

A particularly advantageous utilization of a device can be found for example in a digital telephone answering machine. Data which must be programmed occur continuously in digital telephone answering machines, such as with speech compression for speech recording. Under these given premises, the time and size of the buffer memory can be chosen so that a continuous distribution of the writing process can be selected over a total time and therefore independently of the actual programming time. Since with speech compression and the pertinent speech compression algorithms a reciprocal relationship generally exists between the computation output and the data rate, the result with all types of compression by means of compression algorithms is an optimum utilization of the available computation output of the central processing unit.

What is claimed is:

1. In a main program to be executed for processing data in a processing unit, a method of programming a flash EEPROM comprising the steps of:

1) writing by the main program the processed data into a buffer memory;
   2) initializing an interrupt routine by said processing unit at regular time intervals;
   3) checking by said interrupt routine an initial condition for writing into said flash EEPROM; and
   4) if the initial condition is fulfilled, reading the data from the buffer memory and sending a programming sequence including said processed data read from the buffer memory to the flash EEPROM in order to program the flash EEPROM, wherein the execution of the main program is resumed after the sending of the programming sequence to the EEPROM in step 4 regardless of whether the programming of the EEPROM is completed and wherein the interrupt routine determines whether the initial condition is fulfilled such that the flash EEPROM is not in a writing state and the processed data to be used in programming the flash EEPROM are present in the buffer memory.

2. The method of claim 1, wherein the main program continues to be carried out in the event that the initial condition is not fulfilled.

3. The method of claim 1, wherein the main program is carried out while the programming of the flash EEPROM takes place.

4. The method of claim 1, wherein no new programming sequence with new processed data is sent to the flash EEPROM while the flash EEPROM is in a write state.

5. The method of claim 1 further comprising the step of determining whether the writing to the flash EEPROM has been completed without errors.

6. The method of claim 1, wherein the time interval between the initialization of interrupt routines is selectable and is chosen to be greater than an average programming time of the flash EEPROM.

7. The method of claim 1, wherein the time interval between the initialization of interrupt routines is selectable and is chosen to be greater than an average programming time of the flash EEPROM.

8. The method of claim 1 wherein the programming sequence comprises a series of programming steps.

9. An apparatus for programming a flash EEPROM (F-EE) comprising a processing unit (CPU) to process data, and a buffer memory (PS), wherein the processing unit executes a main program which writes the processed data into the buffer memory;

initializes an interrupt routine at regular time intervals to check an initial condition; and, if the initial condition is fulfilled,
   reads the processed data from the buffer memory and sends a programming sequence including the data read from the buffer memory to the flash EEPROM for programming the flash EEPROM, wherein the execution of the main program is resumed after the sending of the programming sequence to the EEPROM regardless of whether the programming of the EEPROM is completed and wherein the interrupt routine determines whether the initial condition is fulfilled such that the flash EEPROM is not in a writing state and the processed data to be used in programming the flash EEPROM are present in the buffer memory.

10. The apparatus of claim 9, wherein said buffer memory comprises a circular buffer.

11. The apparatus of claim 9, wherein the processing unit (CPU) includes a time function.

12. The apparatus of claim 9, wherein the processing unit (CPU) comprises a microcontroller.

13. The apparatus of claim 9, wherein the processing unit (CPU) comprises a digital signal processing unit.

14. The use of the apparatus as claimed in claim 9 in a digital telephone answering set.

15. The telephone answering set of claim 14, wherein a speech compression algorithm is used for speech recording and wherein the time interval for the initialization of interrupt routine and the size of the buffer memory are selectable and are chosen so that a continuous distribution of the writing process to the flash EEPROM can be selected over a total time and therefore independently of the actual programming time.

* * * * *

UNITED STATES PATENT AND TRADEMARK OFFICE
CERTIFICATE OF CORRECTION

PATENT NO : 6,085,281
DATED : July 4, 2000
INVENTOR(S) : Kopp et al.
METHOD AND A DEVICE FOR PROGRAMMING A FLASH EEPROM It is certified that error appears in the above-identified patent and that said Letters Patent are hereby corrected as shown below:

In the title (page 1), "Performing" should be --Programming--.

At column 1, line 2 (Title), "Performing" should be --Programming--.

Signed and Sealed this

Third Day of April, 2001

Attest:

NICHOLAS P. GODICI

Attesting Officer

Acting Director of the United States Patent and Trademark Office